(12) United States Patent
Bernard et al.

(10) Patent No.: US 6,507,053 B1
(45) Date of Patent: *Jan. 14, 2003

(54) HIGHLY RELIABLE OTP DEVICE

(75) Inventors: Patrick Bernard, Poisat (FR); Jacques Quervel, Montbonnot (FR); Christophe Magnier, Coublevie (FR)

(73) Assignee: STMicroelectronics S.A., Gentilly (FR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/318,589

(22) Filed: May 25, 1999

(30) Foreign Application Priority Data

May 27, 1998 (FR) ............................................. 98 06860

(51) Int. Cl.[7] .............................................. H01L 27/10
(52) U.S. Cl. ...................................... 257/209; 257/530
(58) Field of Search ................................ 257/209, 530; 365/96, 200

(56) References Cited

U.S. PATENT DOCUMENTS

| | | | |
|---|---|---|---|
| 4,592,025 A | 5/1986 | Takemae et al. ............ 365/200 |
| 4,969,124 A | 11/1990 | Luich et al. ................ 365/201 |
| 5,656,967 A | 8/1997 | Casper et al. ............... 327/525 |
| 5,712,588 A | * | 1/1998 | Choi et al. .................... 365/96 |
| 5,925,920 A | * | 7/1999 | MacArthur et al. ......... 257/530 |

OTHER PUBLICATIONS

French Search Report from French Patent Application 98 06860, filed May 27, 1998.

"Fused Decoupling Capacitor With Test Electrode" IBM Technical Disclosure Bulletin, vol. 31, No. 11, Apr. 1, 1989, pp. 53–55.

* cited by examiner

Primary Examiner—Phat X. Cao
(74) Attorney, Agent, or Firm—Wolf, Greenfield & Sacks, P.C.; James H. Morris

(57) ABSTRACT

The present invention relates to a one-time programmable (OTP) device including three fuses connected in parallel to a logic element which determines that the device is programmed when at least one of the fuses open. The present invention comprises a one-time programmable device that, before the one-time programmable device is programmed, provides, in response to a test signal, a simulation output signal that simulates an output signal that the one-time programmable device provides if the one-time programmable device is programmed.

18 Claims, 2 Drawing Sheets

HIGHLY RELIABLE OTP DEVICE

BACKGROUND OF THE INVENTION

1. Field of the Invention

The present invention relates to one-time programmable (OTP) devices used in microelectronics, and more specifically to such devices using semiconductor fuses.

2. Discussion of the Related Art

OTP devices using semiconductor fuses find many applications in microelectronics. They are, for example, used to short-circuit resistors in a chain of series resistors to adjust a reference voltage in an integrated circuit. Such OTP devices may also be used to permanently store, in an integrated circuit, after its manufacturing, data enabling identification of the circuit from the outside, or required by the circuit operation.

FIG. 1 shows a portion 10 of an integrated circuit including a conventional OTP device 20. Device 20 includes a logic gate 22 and a fuse 24. Logic gate 22 receives a selection signal S from a selection device 26 and a programming signal P. Fuse 24 is arranged between the output F of logic gate 22 and an output O. A fuse here designates a device including a fusible element, means for fusing the fusible element, generally by over-current, and means for generating a binary output O indicating whether the fusible element has fused or not. The structure of this device is well known in the art and will not be detailed herein.

To program device 20, signal S is activated to select device 20, and programming signal P is activated. Then, logic gate 22 generates a signal F which causes the fusing of fuse 24. Selection device 26 is generally controlled by an external control signal C.

A conventional device such as shown in FIG. 1 has several significant disadvantages. It may occur that fuse 24 does not completely fuse when receiving signal F. Thus, in some cases, the fuse may generate an incorrect value after programming. In practice, the probability of a failure is approximately 1%. When a fuse has not completely fused, it is difficult to have it completely fuse by a second programming, since its resistance is then too high to reach the fusing energy with the admissible programming voltage.

Further, a properly fused, that is, non-conductive fuse 24 may become conductive again in the course of time, by recombination of the fused elements. The probability of such a recombination is approximately 1%.

Moreover, circuit 10 may be submitted to electrostatic discharges which can, in some conditions, simultaneously activate signals P and S. Element 20 may under such circumstances be untimely programmed.

Eventually, when using an OTP device such as that in FIG. 1 for settings, for example, to short-circuit resistors in a chain of resistors enabling determination of a reference voltage, it may be desirable to have a way of knowing the effect of the programming of device 20 before effectively programming it.

Because of the combination of the above-mentioned disadvantages, those skilled in the art consider semiconductor fuse devices as unreliable. As a result, for example, such devices are not used in applications for which a high programming reliability is indispensable. In such applications, more complex programming means are then used.

SUMMARY OF THE INVENTION

An object of the present invention is to provide a fuse one-time programmable device, the programming of which is particularly reliable.

Another object of the present invention is to provide such a device which is protected from electrostatic discharges.

Another object of the present invention is to provide such a device associated with means for knowing the effect of the programming before proceeding to the programming.

To achieve these objects, as well as others, the present invention provides an one-time programmable device including three fuses connected in parallel to a logic element which determines that the device is programmed when at least one of the fuses is open.

According to an embodiment of the present invention, the device includes means for checking the programming of the fuses and declaring the device to be not suitable if less than two fuses are open.

According to an embodiment of the present invention, the device is programmable by a programming signal.

According to an embodiment of the present invention, the logic element is provided to indicate a programmed state of the device when it receives a test control signal.

According to an embodiment of the present invention, the device includes a circuit for preventing the programming signal to be generated by an electrostatic discharge.

The foregoing objects, features and advantages of the present invention will be discussed in detail in the following non-limiting description of specific embodiments in connection with the accompanying drawings.

DETAILED DESCRIPTION

The present invention provides, to avoid the reliability disadvantages of a single-fuse device, a redundant-fuse device. An immediate solution to implement this redundancy would be to connect the fuses in series. A device using series-connected redundant fuses would be particularly reliable, but the fusing of the fuses would be difficult to perform and the devices enabling this operation would use a relatively large surface area. According to the present invention, it is conversely provided to use the redundant fuses in parallel.

Figure 1:
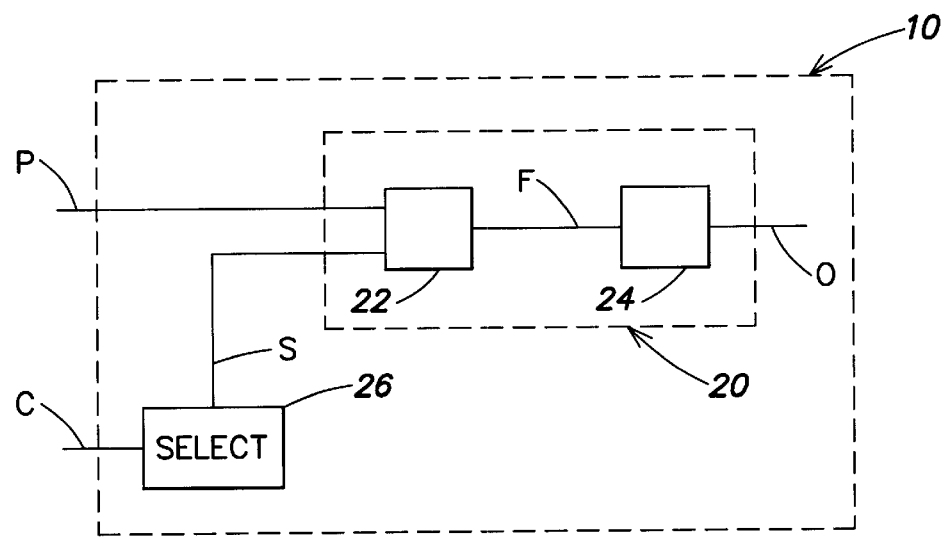
FIG. 1, previously described, schematically shows a portion of an integrated circuit including an OTP device according to the state of the art.
Figure 2:
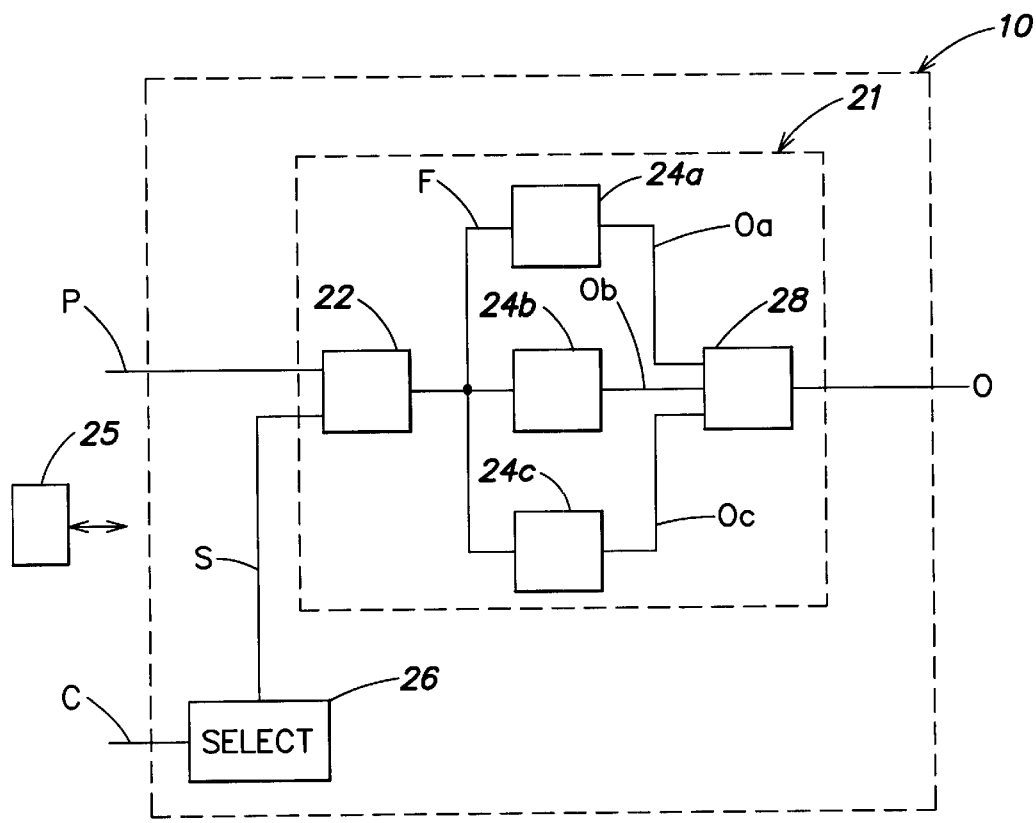
FIG. 2 schematically shows a portion of an integrated circuit including a first embodiment of an OTP device according to the present invention.

In FIG. 2, an integrated circuit 10 includes an OTP device 21 according to the present invention. This device 21 includes three fuses 24a, 24b, and 24c of conventional type, respectively generating three output signals $O_a$, $O_b$, and $O_c$. Device 21 also includes a two-input logic gate 22. Logic gate 22 is similar to that described in relation with FIG. 1: it receives control signals P and selection signals S and generates a programming signal F when signals P and S are both activated. Selection signal S is also generated, as in FIG. 1, by a selection device 26.

Device 21 includes a logic gate 28 which receives output signals $O_a$, $O_b$, and $O_c$ from fuses 24a, 24b, and 24c. Gate 28 generates a binary signal O which is active, that is, which corresponds to a programmed state, when one at least of the three signals $O_a$, $O_b$, and $O_c$ is active, that is, when one at least of the three fuses has fused.

Device 21 is programmed by conventionally fusing the three fuses 24a, 24b, and 24c. A single properly fused fuse is sufficient to guarantee a proper programming. Noting p the probability for a fuse to be properly fused, the probability for at least one fuse among the three to be fused is $p^3+3(1-p)p^2+3(1-p)^2p$. If p=0.99, the probability of properly programming device 21 is 0.999997, which makes it adequate for many applications which are not possible with conventional single-fuse devices.

Similarly, noting q the probability for a fused fuse to become conductive again by recombination, the probability for the three fused fuses to all recover their conductive state is $q^3$, and the probability for two fused fuses to recover their conductive state is $q^2$. Thus, the probability for a properly programmed device 21 to return to an unprogrammed state is: $p^3q^3+3(1-p)p^2q^2+3(1-p)^2pq$.

If p is equal to 0.99 and q is equal to 0.01, a value of 6.8 $10^{-6}$ is obtained, against $9.9\ 10^{-3}$ for a conventional single-fuse device.

Preferably, to increase the long-term reliability of the programming of an element 21, it is provided to check whether at least two of fuses 24a to 24c are properly fused. This checking is performed by a conventional measurement of leakage currents by means of an external test equipment 25, or by an internal automated test device (BIST), not shown. If the measurements determine that at least two of the three fuses have effectively fused, the user or, if present, the automated test device, determines that device 21 has been successfully programmed. If less than two fuses have fused in the programming, device 21 will be considered as being incorrectly programmed. It will have to be envisaged not to use it, as in the case of a misprogrammed conventional device.

In this case, noting p the probability for a fuse to have properly fused, the probability for at least two fuses among the three to have properly fused, that is, the probability for the device to be considered as properly programmed, is $y=p^3+3(1-p)p^2$. If p=0.99, y+0.9997 is obtained.

In the case where the programming of device 21 has effectively only fused two fuses, each of the two fuses will have to become conductive again, for example, by recombination, so that output O of gate 28 switches and no longer indicates that device 21 is programmed.

In the case where the programming of device 23 has fused all three fuses, each of the three fuses will have to become conductive again so that gate 28 no longer indicates the programming of device 23.

Thus, the probability r for a device 23 considered as properly programmed to return to an unprogrammed state is such that $r=p^3q^3+3(1-p)p^2q^2$.

Taking p equal to 0.99 and q equal to 0.01, r is equal to $3.9\ 10^{-6}$. It should be noted that a still better reliability than in the previously described case, where it is not checked whether at least two fuses have fused in the programming is obtained.

The device shown in FIG. 2 implies a simultaneous fusing of the three fuses 24a to 24c, which requires a strong current during the programming of device 21. This is not necessarily easy to obtain in an integrated circuit. It is thus provided to separately fuse fuses 24a to 24c.

Figure 3:
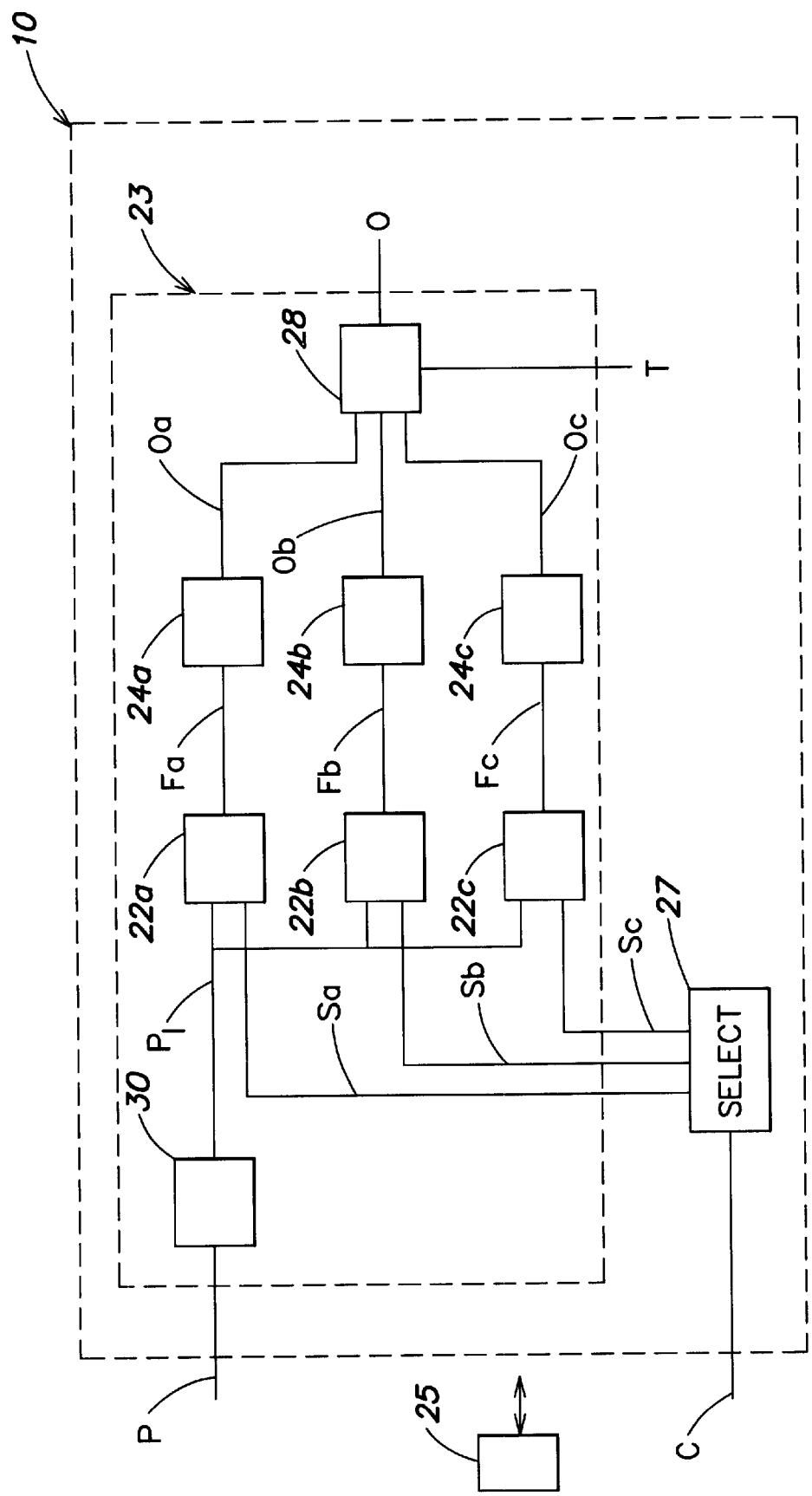
FIG. 3 schematically shows a portion of an integrated circuit including a second embodiment of an OTP device according to the present invention.

FIG. 3 shows an embodiment of an OTP device 23 enabling this. In this embodiment, conversely to that of FIG. 2, each fuse 24 (24a, 24b, 24c) receives the output F ($F_a$, $F_b$, $F_c$) of a respective gate 22 (22a, 22b, 22c), each gate 22 receiving an OTP signal P and a respective selection signal S ($S_a$, $S_b$, $S_c$). Each gate 22 (22a, 22b, 22c) provides the corresponding fuse 24 (24a, 24b, 24c) with a control signal F ($F_a$, $F_b$, $F_c$) when the corresponding signal S ($S_a$, $S_b$, $S_c$) and signal P are both activated.

Selection signals $S_a$, $S_b$, $S_c$ are generated by a selection device 27 receiving an external control signal C. Selection device 27 is provided to sequentially activate signals $S_a$ to $S_c$ upon activation of signal C. Thus, by simultaneously activating signals C and P, the three fuses 24 are fused one after the other with a minimum current surge.

Device 23 is preferably provided with an element of protection 30 against electrostatic discharges between external programming signal P and logic gates 22a to 22c. Protection element 30 receives signal P and generates a signal $P_f$ corresponding to the filtered received signal P, that is, rid of possible parasitic components introduced by an electrostatic discharge. Thus, when circuit 10 undergoes an electrostatic discharge, programming signal $P_f$ remains inactivated and no untimely programming can occur.

In a conventional OTP device, no means of knowing the effect of the device programming in advance are available. Thus, once the device has been programmed, if the effect of the programming causes an unexpected circuit reaction, it is too late to go back and the circuit will not operate as desired.

To avoid this, in the embodiment shown in FIG. 3, device 23 is provided with a test signal T, generated by internal means (not shown) or means coming from outside of circuit 10. Signal T is provided to logic gate 28. Logic gate 28 is devised for, when receiving test signal T, activating signal O as if device 23 were programmed. Thus, when device 23 is used, for example, to adjust a parameter of circuit 10, it will be possible, before definitively programming the device, to judge the effect of the programming upon the adjustment of said parameter.

It should be noted that the advantages of the OTP device according to the present invention are to be balanced with a substantial increase of the surface with respect to a conventional OTP device. However, this size increase is compensated by the fact that the device may now be used for many applications in which the reliability of conventional OTP devices was insufficient. Electronic circuits used in automobile security circuits, for example, to control the tire pressure, are one example application.

Of course, the present invention is likely to have various alterations, modifications, and improvements which will readily occur to those skilled in the art. For example, an element of protection against electrostatic discharges could be inserted directly at the level of the input of each of logic gates 22a, 22b, and 22c.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A one-time programmable device including three fuses, that is programmed by fusing at least one of the three fuses, and that is connected to a logic element which determines that the one-time programmable device is programmed when at least one of the fuses is fused, wherein, before the one-time programmable device is programmed, the logic element, in response to a test control signal, provides an output as if the one-time programmable device is programmed.

2. The one-time programmable device of claim 1, including means for checking fusing of the fuses and providing an output signal indicating that the one-time programmable device is not suitable if less than two fuses are fused.

3. The one-time programmable device of claim 1, programmable by a programming signal.

4. The one-time programmable device of claim 1, including a circuit for preventing the programming signal to be generated by an electrostatic discharge.

5. A one-time programmable device comprising:

a plurality of fuses fusible by a programming signal; and a logic element, coupled to the plurality of fuses, that indicates whether the one-time programmable device is programmed from fused states of the fuses;

wherein the logic element provides a simulation signal that simulates a signal that is provided by the one-time programmable device if the one-time programmable device is programmed before the one-time programmable device has been programmed.

6. The one-time programmable device of claim 5, further comprising means for checking the fused states of the fuses and providing an output signal indicating that the one-time programmable device is not suitable if less than two fuses are fused.

7. The one-time programmable device of claim 5, further comprising a circuit for preventing unwanted programming of the device by an electrostatic discharge.

8. The one-time programmable device of claim 5, further comprising a selection circuit for selecting one of the plurality of fuses for programming signal.

9. The one-time programmable device of claim 5, wherein the logic element indicates that the one-time programmable device is programmed when at least one fuse of the plurality of fuses is fused.

10. The one-time programmable device of claim 5, further comprising means for checking fusing of the plurality of fuses and providing an output indicating that the one-time programmable device is not suitable if a majority of the plurality of fuses are not fused.

11. A method of programming a one-time programmable device comprising at least two one-time programmable elements, comprising:

programming the at least two one-time programmable elements;

receiving a test control signal; and before the one-time programmable elements have been programmed, providing a simulation signal that simulates a signal that is provided by the one-time programmable device if the one-time programmable elements are programmed.

12. The method of claim 11, further comprising a step of providing a signal corresponding to a programmed state of the one-time programmable device.

13. The method of claim 11, further comprising checking a programmed state of the at least two one-time programmable elements and providing an output signal indicating.

14. A one-time programmable device comprising:

a plurality of fuses fusible by a programming signal;

a circuit that indicates the one-time programmable device is programmed when at least one fuse of the plurality fuses is in a fused state; and means for providing a simulation signal simulating that the one-time programmable device is programmed before the one-time programmable device has been programmed.

15. The one-time programmable device of claim 14, further comprising: means for selecting one of the plurality of fuses for fusing by the programming signal.

16. The one-time programmable device of claim 14, further comprising means for checking fusing of the plurality of fuses and providing an output signal indicating that the one-time programmable device is not suitable if a majority of the plurality of fuses is not fused.

17. A one-time programmable device comprising:

one-time programmable elements, wherein the one-time programmable device is programmed by programming at least one of the one-time programmable elements; and a circuit that, in response to receipt of a test signal, provides an output signal simulating that the one-time programmable device is programmed before the one-time programmable device has been programmed.

18. The one-time programmable device of claim 17, further comprising means for checking programming of the one-time programmable elements and providing an output signal indicating that the one-time programmable device is not suitable if a majority of the one-time programmable elements are not programmed.

* * * * *

UNITED STATES PATENT AND TRADEMARK OFFICE
CERTIFICATE OF CORRECTION

PATENT NO. : 6,507,053 B1 Page 1 of 1
DATED : January 14, 2003
INVENTOR(S) : Patrick Bernard, Jacques Quervel and Christopher Magneir It is certified that error appears in the above-identified patent and that said Letters Patent is hereby corrected as shown below:

<u>Column 3,</u>
Line 45, should read:

-- In the case where the programming of device 21 has fused --

Signed and Sealed this

Twenty-seventh Day of May, 2003

JAMES E. ROGAN
*Director of the United States Patent and Trademark Office*